United States Patent
Stolpman

(10) Patent No.: US 7,458,010 B2
(45) Date of Patent: Nov. 25, 2008

(54) IRREGULARLY STRUCTURED, LOW DENSITY PARITY CHECK CODES

(75) Inventor: Victor Stolpman, Irving, TX (US)

(73) Assignee: Nokia Corporation, Espoo (FI)

( * ) Notice: Subject to any disclaimer, the term of this patent is extended or adjusted under 35 U.S.C. 154(b) by 511 days.

(21) Appl. No.: 11/174,335

(22) Filed: Jul. 1, 2005

(65) Prior Publication Data

US 2006/0031734 A1    Feb. 9, 2006

Related U.S. Application Data

(60) Provisional application No. 60/599,283, filed on Aug. 5, 2004.

(51) Int. Cl.
G06F 11/00    (2006.01)
(52) U.S. Cl. .................................................. 714/800
(58) Field of Classification Search ................. 714/800, 714/801, 807
See application file for complete search history.

(56) References Cited

U.S. PATENT DOCUMENTS

| | | | |
|---|---|---|---|
| 6,298,035 B1 | 10/2001 | Heiskala | |
| 6,675,012 B2 | 1/2004 | Gray | |
| 6,738,599 B2 | 5/2004 | Black et al. | |
| 7,302,629 B2 * | 11/2007 | Kyung et al. | 714/752 |
| 7,313,752 B2 * | 12/2007 | Kyung et al. | 714/801 |
| 2003/0119481 A1 | 6/2003 | Haverinen et al. | |
| 2004/0097232 A1 | 5/2004 | Haverinen | |

OTHER PUBLICATIONS

Olcer, Decoder architecture for array-code-based LDPC codes. Globecom 2003, IEEE Global Telecommunications Conference, Conference Proceedings, San Francisco, CA., Dec. 1-5, 2003 and IEEE Global Telecommunications Conference, New York, NY, Dec. 1, 2003, 7:2046-2050, XP010677717.

MacKay et al., Comparison of constructions of irregular Gallager codes. IEEE Transactions on Communications, IEEE Service Center, Piscataway, NJ, 47(10): Oct. 1999. XP011009518.

Supplementary European Search Report dated Jan. 25, 2008 for EPO Application No. 05760341.

Victor Stolpman et al., "Irregular Structured LDPC Codes," IEEE C802.16e-04/264, Sep. 20, 2004, pp. 0, 1-22, Nokia, Irving, TX.

Hao Zhong et al., "Design of VLSI Implementation-Oriented LDPC Codes," © 2003 IEEE, Electrical, Computer and Systems Engineering Department Rensselaer Polytechnic Instiitute, pp. 670-673, Troy, New York, USA.

Ajay Dholakia et al., "Rate-Compatible Low Density Parity-check Codes for Digital Subscriber Lines," IEEE Communications Society, IBM Zurich Research Laboratory, pp. 415-419, Rüschlikon, Switzerland.

Deepak Sridhara et al., "Low Density Parity Check Codes from Permutation Matrices," 2001 conference on Information Sciences and Systems, The Johns Hopkins University, Mar. 21-23, 2001, p. 1.

(Continued)

*Primary Examiner*—Shelly A Chase
(74) *Attorney, Agent, or Firm*—Banner & Witcoff, Ltd.

(57) ABSTRACT

An error correction codeword. In one embodiment, an irregularly structured LDPC code ensemble possessing strong overall error performance and attractive storage requirements for a large set of codeword lengths. Embodiments of the invention can offer communication systems with better performance and lower terminal costs due to possible reductions in mandatory non-volatile memory over conventional systems.

25 Claims, 7 Drawing Sheets

OTHER PUBLICATIONS

Arvind Sridharan et al., "A Construction for Low Density Parity Check Convolutional Codes Based on Quasi-Cyclic Block Codes," ISIT 2002, Lausanne, Switzerland, Jun. 30-Jul. 5, 2002, p. 1.

Dale E. Hocevar et al., "LDPC Code Construction with Flexible Hardware Implementation," DSP Solutions R&D Center, Texas Instruments—Dallas, TX, © 2003 IEEE, pp. 2708-2712, USA.

* cited by examiner

FIG. 5

$$H_{SEED,52} = \begin{bmatrix}
1000000000000000000000000110010000100000001000100001 \\
1100000000000000000000000010010001000000001001100 \\
0110000000000000000000000000011000000001001010010 \\
0011000000000000000000000110000000010000010001010 \\
0001100000000000000000000101000000010000100010001 \\
0000110000000000000000000010010000010000001010100 \\
0000011000000000000000000000010000001000001110001 \\
0000001100000000000000000000000000001000010001110 \\
0000000110000000000000000001001000000000100100010 \\
0000000011000000000000000000000000001001001001100 \\
0000000001100000000000000000000000000100001001001001 \\
0000000000110000000000000000001000000000000011011 \\
0000000000011000000000000000000000000001000011100100 \\
0000000000001100000000000000100000010000001000001010 \\
0000000000000110000000000000000100000000001001100001 \\
0000000000000011000000000000000010000001000010010100 \\
0000000000000001100000000000000000010000000001010101 \\
0000000000000000110000000000010000000000001010101010 \\
0000000000000000011000000000100000000000100010001001 \\
0000000000000000001100000000001000000010000001010100 \\
0000000000000000000110000000000100001000001000100010 \\
0000000000000000000011000001000000000010000000011010 \\
0000000000000000000001100000000000000000000011100101 \\
0000000000000000000000110000000010000010100000010100 \\
0000000000000000000000011000000000010000000101001010 \\
0000000000000000000000001100000000010000100010100001
\end{bmatrix}$$

FIG. 6

$$H_{SEED,61} = \begin{bmatrix}
1000000000000000000101000000000001000000000010100001010011101 \\
1100000000000000000000001000100000100001000000001101110001 \\
0110000000000000000000001000100000100001000100001100111100 \\
0011000000000000000010100100000001000010000000010011001000001 \\
0001100000000000000010000010000000010000100001001100100101 0 \\
0000110000000000000100000000000010000000000010000010110110111 \\
0000011000000000000000010000100001000000000000101110100101 \\
0000001100000000000000100000000000001001000000010110101110 \\
0000000110000000000000110000000100100000000000010000110100 11 \\
0000000011000000000010000010000001000000000000110101010101 \\
0000000001100000000000000010010000100010000010000100010101 1 \\
0000000000110000000000000001000000001000000000011011011101 \\
000000000001100000000010001000000000010000001000010110101100 \\
0000000000001100000000000000011010010000110000000010110100 0 \\
0000000000000110000000001001001000000000100010000001000101101 0 \\
00000000000000011000010010000000010010000000000010110110010 \\
0000000000000000110000100000010000010010000000100001100110000 1 \\
000000000000000001100000000000000100000010000011111000001011 0 \\
0000000000000000001101000010010000000000011010000001101100000 \\
0000000000000000000110000000000010000001100010000000100011111
\end{bmatrix}$$

FIG. 7

$$\mathbf{H}_{SEED,56} = \begin{bmatrix}
1000000000000100100000000100111100000000100100110111010 \\
1100000000000000110001110000000100000000000001011011111 \\
0110000000000100010000000100000010000001000001111101111 \\
0011000000000000001000000011000001000000100001111111111 \\
0001100000000001001010100010001000010000100010101100101 \\
0000110000000100000001000001000001000100001001111011110 \\
0000011000000000100000010100010010011000000101110110001 \\
0000001100000000000101001000000010000100000010111111111 \\
0000000110000100010010010010100000101000011001100000011 \\
0000000011000001000100000000011100000100000011111111010 \\
0000000001100000110000000000000011101010000110011011101 \\
0000000000110001000010010010001000000111000000001010101111 \\
0000000000011000000100000001000000000000011100011111111110 \\
0000000000001101000001000100000010000000000001111010111101
\end{bmatrix}$$

IRREGULARLY STRUCTURED, LOW DENSITY PARITY CHECK CODES

CROSS-REFERENCE TO RELATED PATENT APPLICATIONS

This application is an application claiming the benefit under 35 USC 119(e) of U.S. Application No. 60/599,283, filed Aug. 5, 2004, incorporated herein by reference in its entirety.

FIELD OF THE INVENTION

The present invention relates generally to correction codes in communication systems. More particularly, the present invention relates to the use of correction codes for reliably conveying information through channels having random events.

BACKGROUND OF THE INVENTION

Modern communication systems use Forward Error Correction (FEC) codes in an attempt to convey information more reliably through channels with random events. One such FEC error control system uses low density parity check (LDPC) codes. LDPC codes can have error correcting capabilities that rival the performance of "Turbo-Codes" and can be applicable over a wide range of statistical channels. In fact, some random irregular LDPC constructions based upon edge ensemble designs have error correcting capabilities measured in Bit Error Rate (BER) that are within 0.05 dB of the rate-distorted Shannon limit. Unfortunately, these LPDC code constructions often require long codeword constructions (on the order of $10^6$ to $10^7$ bits) in order to achieve these error rates. Despite good BER performance, these random code constructions often have poor Block Error Rate (BLER) performances. Therefore, these random constructions typically do not lend themselves well to packet-based communication systems.

Another disadvantage of random constructions based on edge distribution ensembles is that, for each codeword length, a separate random construction is needed. Thus, communication systems employing variable block sizes (e.g. TCP/IP systems) require multiple code definitions. Such multiple code definitions can consume a significant amount of non-volatile memory for large combinations of codeword lengths and code rates.

As an alternative to random LDPC constructions, structured LDPC constructions typically rely on a general algorithmic approach to constructing LDPC matrices which often requires much less non-volatile memory than random constructions. One such structured approach is based upon array codes. This approach can exhibit improved error performance (both BER and BLER performance) and a relatively low error floor for relatively high code rates (higher than 0.85). However, for code rates below 0.85, these code constructions have relatively poor performance with respect to irregular random constructions designed for lower code rates. One reason for this poor performance can be that their constructions are typically based on code ensembles that have poor asymptotic performances despite being an irregular construction.

One challenge therefore is to design irregular structured LDPC codes that have good overall error performance for a wide range of code rates with attractive storage requirements. Such resulting LDPC codes would provide a better performing communication system with lower cost terminals. These factors can make such FEC attractive for applications over a wide range of products, including but not limited to, wireless LAN systems, next generation cellular systems, and ultra wide band systems.

SUMMARY OF THE INVENTION

Embodiments of the present invention provides for an irregularly structured LDPC code ensemble that has strong overall error performance and attractive storage requirements for a large set of codeword lengths. Embodiments of the invention offer communication systems with better performance and lower terminal costs due to the reduction in mandatory non-volatile memory over conventional systems.

In contrast to conventional approaches, embodiments of the invention provide a structured approach to construction, offering reduced storage requirements and a simple construction. When used with seed matrices with good asymptotic performances and good girth properties, the irregularly structured LDPC codes used in embodiments of the present invention offer an improved overall level of error performance. Embodiments of the invention also offer a parity-check matrix that is lower in density than conventional array codes because there are fewer non-zero sub-matrices (i.e. there are more sub-matrices consisting of the all zeros matrix).

These and other objects, advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 5 is an example of a code rate 1/2 irregular parity-check matrix according to one embodiment of the present invention;

FIG. 6 is an example of a code rate 2/3 irregular parity-check matrix according to one embodiment of the present invention; and FIG. 7 is an example of a code rate 3/4 irregular parity-check matrix according to one embodiment of the present invention.

DETAILED DESCRIPTION OF THE PREFERRED EMBODIMENTS

Figure 1:
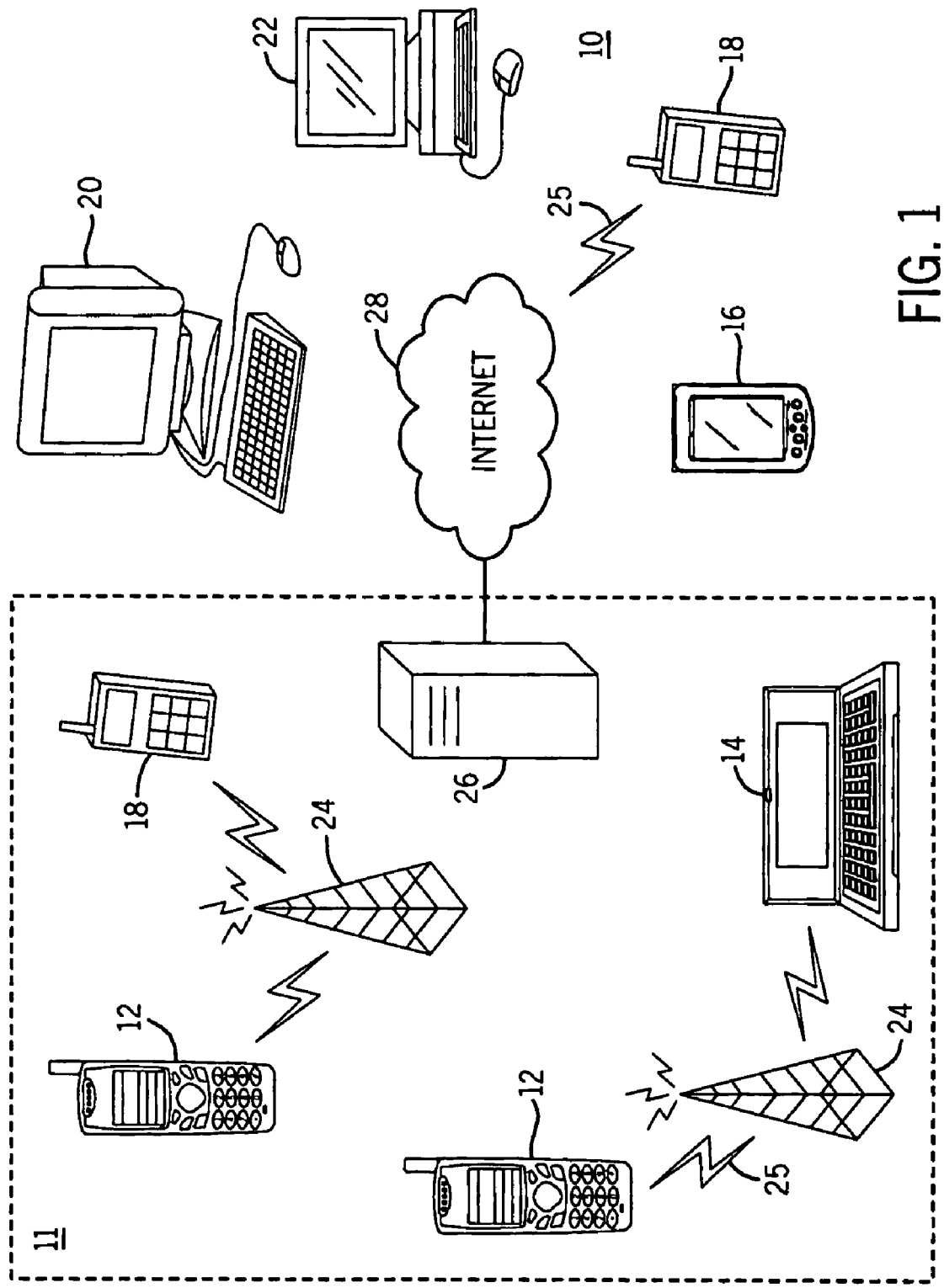
FIG. 1 is an overview diagram of a system within which embodiments of the invention may be implemented.

Various exemplary embodiments of the invention are described below with reference to the drawing figures. One embodiment of the invention can be described in the general context of method steps, which may be implemented in one embodiment by a program product including computer-executable instructions, such as program code, executed by computers in networked environments. Embodiments of the invention may be implemented in either hardware or software, and can be placed both within a transmitter and/or a receiver.

FIG. 1 shows a system 10 illustrating one embodiment of the invention, comprising multiple communication devices that can communicate through a network. The system 10 may comprise any combination of wired or wireless networks including, but not limited to, a mobile telephone network, a wireless Local Area Network (LAN), a Bluetooth personal area network, an Ethernet LAN, a token ring LAN, a wide area network, the Internet, etc. The system 10 may include both wired and wireless communication devices.

For exemplification, the system 10 shown in FIG. 1 can include a mobile telephone network 11 and the Internet 28. Connectivity to the Internet 28 may include, but is not limited to, long range wireless connections, short range wireless connections, and various wired connections including, but not limited to, telephone lines, cable lines, power lines, and the like.

Figure 4:
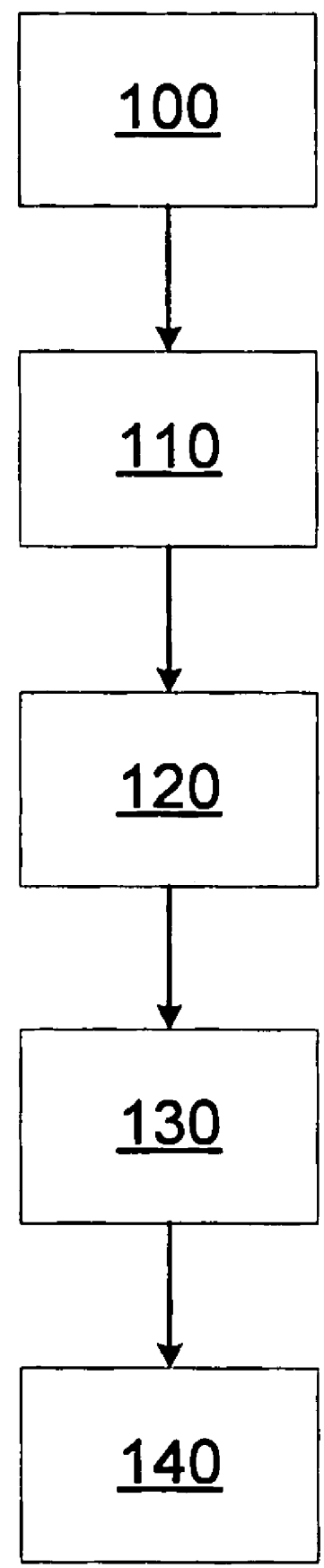
FIG. 4 is a flow chart showing the implementation of one embodiment of the present invention.

Exemplary communication devices of the system 10 may include, but are not limited to, a mobile telephone 12, a combination PDA and mobile telephone 14, a PDA 16, an integrated messaging device (IND) 18, a desktop computer 20, and a notebook computer 22. The communication devices may be stationary or mobile as when carried by an individual who is moving. The communication devices may also be located in a mode of transportation including, but not limited to, an automobile, a truck, a taxi, a bus, a boat, an airplane, a bicycle, a motorcycle, etc. Some or all of the communication devices may send and receive calls and messages and communicate with service providers through a wireless connection 25 to a base station 24. The base station 24 may be connected to a network server 26 that allows communication between the mobile telephone network 11 and the Internet 28. The system 10 may include additional communication devices and communication devices of different types. A communication device may communicate using various media including, but not limited to, radio, infrared, laser, cable connection, and the like. One such portable electronic device incorporating a wide variety of features is shown in FIG. 4. This particular embodiment may serves as both a video gaming device and a portable telephone.

The communication devices may communicate using various transmission technologies including, but not limited to, Code Division Multiple Access (CDMA), Global System for Mobile Communications (GSM), Universal Mobile Telecommunications System (UMTS), Time Division Multiple Access (TDMA), Frequency Division Multiple Access (FDMA), Transmission Control Protocol/Internet Protocol (TCP/IP), Short Messaging Service (SMS), Multimedia Messaging Service (MMS), e-mail, Instant Messaging Service (IMS), Bluetooth, IEEE 802.11, etc.

Figure 2:
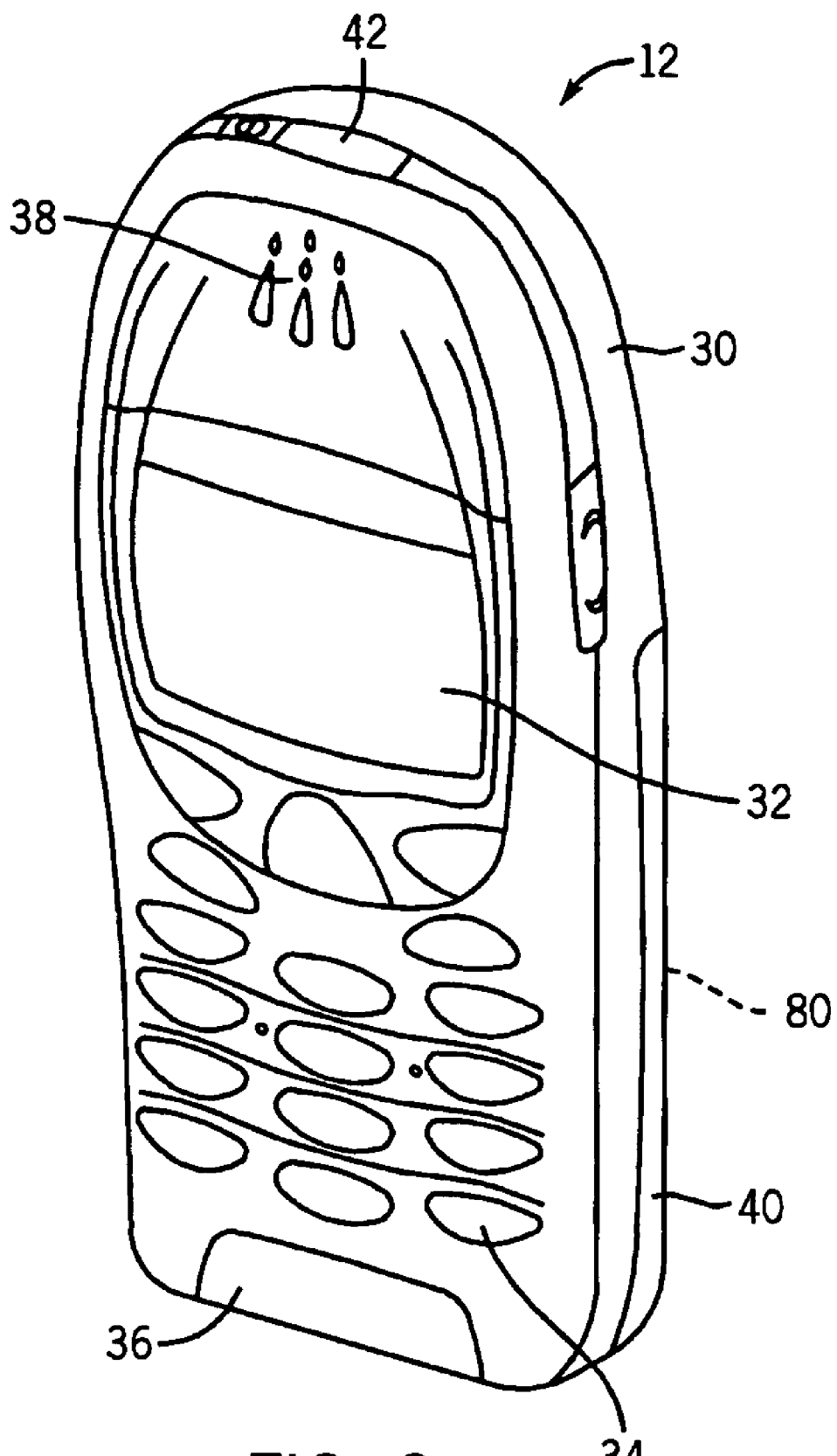
FIG. 2 is a perspective view of a mobile telephone that can be used in the implementation of one embodiment the present invention.
Figure 3:
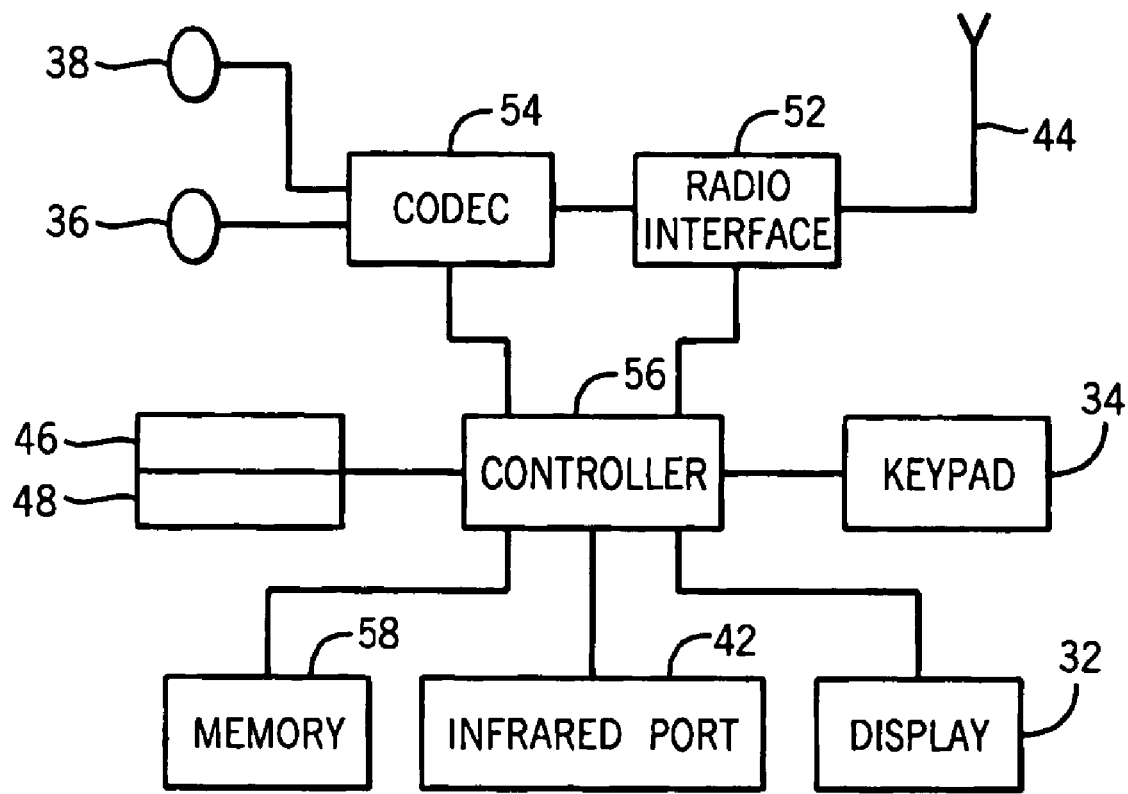
FIG. 3 is a schematic representation of the telephone circuitry of the mobile telephone of FIG. 2.

FIGS. 2 and 3 show one representative mobile telephone 12 within which one embodiment of the present invention may be implemented. It should be understood, however, that the present invention is not intended to be limited to one particular type of mobile telephone 12 or other electronic device. The mobile telephone 12 of FIGS. 2 and 3 comprises a housing 30, a display 32 in the form of a liquid crystal display, a keypad 34, a microphone 36, an ear-piece 38, a battery 40, an infrared port 42, an antenna 44, a smart card 46 in the form of a universal integrated circuit card (UICC) according to one embodiment of the invention, a card reader 48, radio interface circuitry 52, codec circuitry 54, a controller 56 and a memory 58.

Generally, program modules can include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule-based logic and other logic to accomplish the various database searching steps, correlation steps, comparison steps and decision steps. It should also be noted that the words "component" and "module" as used herein, and in the claims, are intended to encompass implementations using one or more lines of software code, and/or hardware implementations, and/or equipment for receiving manual inputs.

By taking into account the density evolution of messages passed in belief propagation decoding, random constructions of irregular LDPC codes can be developed that approach Shannon limits for an assortment of channels (e.g. Additive White Gaussian Noise (AWGN), Binary Erasure Channel (BEC), Binary Symmetric Channel (BSC)). These are typically described as ensembles with variable and check edge polynomials $$\lambda(x) = \sum_{i=2}^{d_l} \lambda_i x^{j-1}$$

and $$\rho(x) = \sum_{j=2}^{d_r} \rho_j x^{j-1},$$

respectively, where $\lambda_i$ and $\rho_j$ are the fraction of total edges connected to variable and check nodes of degree i=2,3, ..., $d_l$ and j=2,3, ..., $d_r$ respectively. These random constructions sometimes require the relatively long codeword lengths to approach the capacity limit and do not always provide the strong BLER performance required by packet-based communication systems. In actual communication terminals, these random constructions can require storage of the entire parity-check matrix, and for systems employing variable packet-length, the storage of multiple random constructions is both necessary and costly.

Alternatively, structured approaches to LDPC code designs that allow for reduced storage requirements and simple code description may be used. One such example is the LDPC code construction based upon array constructions. For code rates 0.85 and above, these code constructions can have acceptable performance with good error floors and BLERs. However, with respect to random constructions, these constructions sometimes suffer at lower code rates because they have edge distributions that result in relatively poor asymptotic performance and thus poor performance in general.

It is desirable thus, to provide irregularly structured LDPC codes that have good overall error performance for a wide range of code rates with attractive storage requirements that make communication terminals cost effective. The result of such LDPC codes can do a better performing communication system with lower cost terminals. These factors can make such a FEC attractive for applications over a wide range of products including but not limited to wireless LAN, next generation cellular systems, and ultra wide band systems.

As discussed herein, an irregular "seed" parity-check matrix can be used as the "seed" for irregular structured LDPC code some embodiments according to the present invention. One embodiment invention involves the construction of an irregular "seed" low-density parity check-matrix $H_{SEED}$ of dimension $((N_{SEED}-K_{SEED}) \times N_{SEED})$ derived from an edge distribution, $\lambda_{SEED}(x)$ and $\rho_{SEED}(x)$, with good asymptotic performance and good girth properties. In one embodiment, good asymptotic performance may be characterized by a good threshold value using belief propagation decoding and good girth may be characterized by having very few if no variable nodes with a girth of 4. This can be accomplished manually or via a software program once given the code ensemble and/or node degrees.

Although there are no limits on the maximum values of $K_{SEED}$ and $N_{SEED}$, which represent the number of information bits and the resulting codeword length, respectively in one embodiment, for the code defined by $H_{SEED}$, these values can be relatively small in comparison to the target messageword and codeword length. This can allow for more potential integer multiples of $N_{SEED}$ within the target range of codeword lengths, reduced storage requirements, and simplified code descriptions. In one embodiment of the invention, the smallest possible value for $H_{SEED}$ can be used with edge distributions defined by $\lambda_{SEED}(x)$ and $\rho_{SEED}(x)$, while still maintaining good girth properties.

One function of the seed matrix can be to identify the location and type of sub-matrices in the expanded LDPC parity-check matrix H constructed from $H_{SEED}$ and a given set of permutation matrices. The permutation matrices in $H_{SEED}$ can determine the location of sub-matrices in the expanded matrix H that contain a permutation matrix of dimension $(N_{SPREAD} \times N_{SPREAD})$ from the given set. One selection within the given set of permutation matrices is defined below. As an example only, the given set of permutation matrices used herein can be finite and consist of the set $$\{P_{SPREAD}^{\infty}, P_{SPREAD}^{0}, P_{SPREAD}^{1}, P_{SPREAD}^{2}, \ldots, P_{SPREAD}^{p-1}\}$$

where p is a positive integer (a prime number in a preferred embodiment of the invention), $P_{SPREAD}^{0}=I$ is the identity matrix, $P_{SPREAD}^{1}$ is a full-rank permutation matrix, $P_{SPREAD}^{2}=P_{SPREAD}^{1}P_{SPREAD}^{1}$, etc. up to $P_{SPREAD}^{p-1}$. One example embodiment of $P_{SPREAD}^{1}$ is a single circular shift mutation matrix $$P_{SPREAD}^{1} = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix} \text{ for } N_{SPREAD} = 5$$

Another example embodiment of $P_{SPREAD}^{1}$ is an alternate single circular shift permutation matrix $$P_{SPREAD}^{1} = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix} \text{ for } N_{SPREAD} = 5.$$

For notational sake, $P_{SPREAD}^{\infty}$ denotes the all zeros matrix 0 of dimension $(N_{SPREAD} \times N_{SPREAD})$ (i.e. $P_{SPREAD}^{\infty}=0$ where every element is a zero), and the zeros in $H_{SEED}$ indicate the location of the sub-matrix $P_{SPREAD}^{\infty}=0$ in the expanded matrix H. Thus, the expanded LDPC matrix H can be of dimension $(N_{SPREAD}(N_{SEED}-K_{SEED}) \times N_{SPREAD}N_{SEED})$ with sub-matrices consisting of permutation matrices of dimension $(N_{SPREAD} \times N_{SPREAD})$ raised to an exponential power from the set of $\{0, 1, \ldots, p-1, \infty\}$.

Furthermore, the expanded LDPC code can have the same edge distribution as $H_{SEED}$ and hence can achieve the desired asymptotic performance described by $\lambda_{SEED}(x)$ and $\rho_{SEED}(x)$, provided both $H_{SEED}$ and the expanded matrix H have satisfactory girth properties.

The following description concerns one embodiment of the invention that constructs a structured array exponent matrix that may be described as $$E_{ARRAY} = \begin{bmatrix} E_{1,1} & E_{1,2} & \ldots & E_{1,p} \\ E_{2,1} & E_{2,2} & \ldots & E_{2,p} \\ \vdots & \vdots & \ddots & \vdots \\ E_{p,1} & E_{p,2} & \ldots & E_{p,p} \end{bmatrix}, \text{ where } E_{i,j} = (i-1)(j-1) \bmod p$$

using modulo arithmetic (but not limited to) of a number p. In one embodiment of the invention, p can be a prime number, but this is not necessary for the principles of the present invention. p can be at least the column dimension of the irregular "seed" parity check matrix and the column dimension of the spreading permutation matrix. In one embodiment, $N_{SEED} \leq p$ and $N_{SPREAD} \leq p$. However, other values are also possible.

Other embodiments of the present invention can use transformed versions of $E_{ARRAY}$. In particular, one such transformation involves the shifting of rows to construct an upper triangular matrix while replacing vacated element locations with $\infty$, i.e.

$$E_{SHIFT} = \begin{bmatrix} E_{1,1} & E_{1,2} & E_{1,3} & \ldots & E_{1,p} \\ \infty & E_{2,1} & E_{2,2} & \ldots & E_{2,p-1} \\ \infty & \infty & E_{3,1} & \ldots & E_{3,p-2} \\ \vdots & \vdots & \vdots & \ddots & \vdots \\ \infty & \infty & \infty & \ldots & E_{p,1} \end{bmatrix}.$$

Another embodiment of the present invention transforms $E_{ARRAY}$ by the truncation of columns and/or rows to select a sub-matrix of $E_{ARRAY}$ for implementation with a specified $H_{SEED}$. Still another embodiment of the invention uses the combination of both shifting and truncation. For example, given $N_{SEED}+1 \leq p$ and $N_{SPREAD} \leq p$ (with p being a prime number in a particular embodiment of the invention)

$$E_{TRUNCATE1} = \begin{bmatrix} E_{1,2} & E_{1,3} & E_{1,4} & \cdots & E_{1,(N_{SEED}-K_{SEED})} & \cdots & E_{1,(N_{SEED}+1)} \\ E_{2,1} & E_{2,2} & E_{2,3} & \cdots & E_{2,(N_{SEED}-K_{SEED}-1)} & \cdots & E_{2,N_{SEED}} \\ \infty & E_{3,1} & E_{3,2} & \cdots & E_{3,(N_{SEED}-K_{SEED}-2)} & \cdots & E_{3,(N_{SEED}-1)} \\ \vdots & \vdots & \ddots & \ddots & \vdots & \ddots & \vdots \\ \infty & \infty & \infty & \cdots & E_{(N_{SEED}-K_{SEED}),1} & \cdots & E_{(N_{SEED}-K_{SEED}),(K_{SEED}+2)} \end{bmatrix}$$

For $N_{SEED}+2 \leq p$ and $N_{SPREAD} \leq p$ (with p being a prime number in a particular embodiment of the invention)

$$E_{TRUNCATE2} = \begin{bmatrix} E_{2,2} & E_{2,3} & E_{2,4} & \cdots & E_{2,(N_{SEED}-K_{SEED})} & \cdots & E_{2,(N_{SEED}+1)} \\ E_{3,1} & E_{3,2} & E_{3,3} & \cdots & E_{3,(N_{SEED}-K_{SEED}-1)} & \cdots & E_{3,N_{SEED}} \\ \infty & E_{4,1} & E_{4,2} & \cdots & E_{4,(N_{SEED}-K_{SEED}-2)} & \cdots & E_{4,(N_{SEED}-1)} \\ \vdots & \vdots & \ddots & \ddots & \vdots & \ddots & \vdots \\ \infty & \infty & \infty & \cdots & E_{(N_{SEED}-K_{SEED}+1),1} & \cdots & E_{(N_{SEED}-K_{SEED}+1),(K_{SEED}+2)} \end{bmatrix}.$$

Many shift and truncate embodiments can be used with the present invention, as well as column and row permutation transformations performed either prior to or after other individual transformations in a nested fashion. More generally, the transformation of the $E_{ARRAY}$ matrix can be described using the functional notation $T(E_{ARRAY})$ that represents a transformed exponent matrix of dimension (($N_{SEED}-K_{SEED}) \times N_{SEED}$). Yet another embodiment of this family of transformations may include an identity transformation. For example, in another embodiment of the invention, $T(E_{ARRAY}) = E_{ARRAY}$.

In one embodiment of the present invention $H_{SEED}$ and $T(E_{ARRAY})$ can be used to construct the final exponent matrix in order to expand the seed matrix into H. The final exponent matrix may be defined as $$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

of dimension (($N_{SEED}-K_{SEED}) \times N_{SEED}$) by replacing each one in $H_{SEED}$ with the corresponding matrix element (i.e. the same row and column) in the transformed structured array exponent matrix $T(E_{ARRAY})$ and each zero in $H_{SEED}$ with $\infty$. Thus, the elements of $F_{FINAL}$ can belong to the set $\{0, 1, \ldots, p-1, \infty\}$ if modulo arithmetic is used in the construction of $E_{ARRAY}$.

The following is a discussion of one embodiment of the expansion of $H_{SEED}$ using $F_{FINAL}$ to construct a final LDPC parity-check matrix H that describes the LDPC code. The matrix $H_{SEED}$ of dimension (($N_{SEED}-K_{SEED}) \times N_{SEED}$) can be spread or expanded using the elements of the permutation matrix set $$\{P_{SPREAD}^{\infty}, P_{SPREAD}^{0}, P_{SPREAD}^{1}, P_{SPREAD}^{2}, \ldots, P_{SPREAD}^{p-1}\}$$

with elements of dimension ($N_{SPREAD} \times N_{SPREAD}$), where $P_{SPREAD}^{\infty} = 0$ is the all zeros matrix, $P_{SPREAD}^{0} = I$ is the identity matrix, $P_{SPREAD}^{1}$ is a permutation matrix, $P_{SPREAD}^{2} = P_{SPREAD}^{1} P_{SPREAD}^{1}$, $P_{SPREAD}^{3} = P_{SPREAD}^{1} P_{SPREAD}^{1} P_{SPREAD}^{1}$, etc. (but not limited to) to construct $$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

of dimension ($N_{SPREAD}(N_{SEED}-K_{SEED}) \times N_{SPREAD} N_{SEED}$). Thus, this embodiment of the present invention can be used to describe an expanded LDPC code with sub-matrices of dimension ($N_{SPREAD} \times N_{SPREAD}$) in the (i,j)$^{th}$ sub-matrix location consisting of the permutation matrix $P_{SPREAD}$ raised to the $F_{i,j}$ power (i.e. $P_{SPREAD}^{F_{i,j}}$).

The following is one particular example of the implementation of one embodiment of the present invention. In this example, $$H_{SEED} = \begin{bmatrix} 1 & 0 & 0 & 1 & 0 & 0 \\ 1 & 1 & 0 & 1 & 1 & 0 \\ 0 & 1 & 1 & 0 & 0 & 1 \\ 0 & 0 & 1 & 0 & 1 & 1 \end{bmatrix}, \text{ thus } N_{SEED} = 6,$$

while $$P^1_{SPREAD} = \begin{bmatrix} 0 & 0 & 1 \\ 1 & 0 & 0 \\ 0 & 1 & 0 \end{bmatrix}, \text{ thus } N_{SPREAD} = 3,$$

Therefore, p=11 is the smallest prime number that satisfies the example conditions $N_{SEED}+2 \leq p$ and $N_{SPREAD} \leq p$. The interim and final exponent matrices as defined above can be:

$$E_{TRUNCATE2} = \begin{bmatrix} 1 & 2 & 3 & 4 & 5 & 6 \\ 0 & 2 & 4 & 6 & 8 & 10 \\ \infty & 0 & 3 & 6 & 9 & 1 \\ \infty & \infty & 0 & 4 & 8 & 1 \end{bmatrix} \text{ and}$$

$$F = \begin{bmatrix} 1 & \infty & \infty & 4 & \infty & \infty \\ 0 & 2 & \infty & 6 & 8 & \infty \\ \infty & 0 & 3 & \infty & \infty & 1 \\ \infty & \infty & 0 & \infty & 8 & 1 \end{bmatrix},$$

and the corresponding expanded LDPC matrix can be:

$$H = \begin{bmatrix} 0&0&1&0&0&0&0&0&0&0&1&0&0&0&0&0&0 \\ 1&0&0&0&0&0&0&0&1&0&0&0&0&0&0&0&0 \\ 0&1&0&0&0&0&0&0&0&1&0&0&0&0&0&0&0 \\ 1&0&0&0&1&0&0&0&1&0&0&0&1&0&0&0&0 \\ 0&1&0&0&0&1&0&0&0&1&0&0&0&1&0&0&0 \\ 0&0&1&1&0&0&0&0&0&0&0&1&1&0&0&0&0 \\ 0&0&0&1&0&0&1&0&0&0&0&0&0&0&0&0&1 \\ 0&0&0&0&1&0&0&1&0&0&0&0&0&0&1&0&0 \\ 0&0&0&0&0&1&0&0&1&0&0&0&0&0&0&1&0 \\ 0&0&0&0&0&0&1&0&0&0&0&0&1&0&0&0&1 \\ 0&0&0&0&0&0&0&1&0&0&0&0&0&1&1&0&0 \\ 0&0&0&0&0&0&0&1&0&0&0&1&0&0&0&1&0 \end{bmatrix}.$$

One embodiment of a method for constructing irregularly structured LDPC codes according to the present invention is depicted in FIG. 4. At step 100, an irregular "seed" parity check matrix $H_{SEED}$ of dimension $((N_{SEED}-K_{SEED}) \times N_{SEED})$ can be constructed, being derived from an edge ensemble, $\lambda_{SEED}(x)$ and $\rho_{SEED}(x)$, with good asymptotic performance. In one embodiment, good asymptotic performance can be characterized by good threshold value using belief propagation decoding and good girth properties such as by having very few if no variable nodes with girth of 4. At step 110, a structured array exponent matrix can be constructed, as shown below:

$$E_{ARRAY} = \begin{bmatrix} E_{1,1} & E_{1,2} & \cdots & E_{1,p} \\ E_{2,1} & E_{2,2} & \cdots & E_{2,p} \\ \vdots & \vdots & \ddots & \vdots \\ E_{p,1} & E_{p,2} & \cdots & E_{p,p} \end{bmatrix} \text{ where } E_{i,j} = (i-1)(j-1) \bmod p$$

This matrix can be constructed using modulo arithmetic of a number p that can be at least the column dimension of the irregular "seed" parity check matrix and the column dimension of the spreading permutation matrix. In other words, $N_{SEED} \leq p$ and $N_{SPREAD} \leq p$.

At step 120, the structured array exponent matrix can be transformed using a transform $T(E_{ARRAY})$ that may perform shifts, truncations, permutations, etc. operations to construct an exponent matrix of dimension $((N_{SEED}-K_{SEED}) \times N_{SEED})$ from $E_{ARRAY}$. At step 130, a final exponential matrix can be constructed, $$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

of dimension $((N_{SEED}-K_{SEED}) \times N_{SEED})$ by replacing each one in $H_{SEED}$ with the corresponding element in the transformed structured array exponent matrix $T(E_{ARRAY})$ and each zero in $H_{SEED}$ with $\infty$. Thus, the elements of $F_{FINAL}$ belong to the set $\{0, 1, \ldots, p-1, \infty\}$.

At step 140, the expanded parity check matrix can be constructed, $$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

of dimension $(N_{SPREAD}(N_{SEED}-K_{SEED}) \times N_{SPREAD}N_{SEED})$ that describes the expanded LDPC code with sub-matrices of dimension $(N_{SPREAD} \times N_{SPREAD})$ in the $(i,j)^{th}$ sub-matrix location consisting of the permutation matrix $P_{SPREAD}$ raised to the $F_{i,j}$ power, i.e. $P_{SPREAD}^{F_{i,j}}$, where $F_{i,j}$ is the matrix element in the $(i,j)^{th}$ location of $F_{FINAL}$.

FIG. 5 is an example of one embodiment of a rate 1/2 irregular parity-check matrix. FIG. 6 is an example of one embodiment of a rate 2/3 irregular parity-check matrix. FIG. 7 is an example of one embodiment of a rate 3/4 irregular parity-check matrix.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated.

What is claimed is:

1. A method of generating an error correction codeword, the method comprising:
   constructing an irregular seed parity check matrix derived from an edge ensemble, the seed parity check matrix having a column dimension and a row dimension;
   constructing a structured array exponent matrix using modulo arithmetic of a number equal to or greater than the seed parity check matrix column dimension;
   constructing a final exponential matrix by replacing each one in the seed parity check matrix with the corresponding element from the structured array exponent matrix and each zero in the seed parity check matrix with infinity;

expanding the final exponential matrix to form a parity check matrix corresponding to the error correction code; and generating an error correction codeword in accordance with the parity check matrix.

2. The method of claim 1 further comprising transforming the structured array exponent matrix prior to constructing the final exponential matrix.

3. The method of claim 2, wherein transforming the structured array exponent matrix comprises performing shift, truncation, and/or permutation operations on the structured array exponent matrix.

4. The method of claim 1 further comprising constructing a set of permutation matrices, wherein the permutation matrices are used to expand the final exponential matrix.

5. The method of claim 4 wherein the set of permutation matrices comprises $\{P_{SPREAD}^{\infty}, P_{SPREAD}^{0}, P_{SPREAD}^{1}, P_{SPREAD}^{2}, \ldots, P_{SPREAD}^{p-1}\}$ and each permutation matrix in the set of permutation matrices comprises a matrix of dimension ($N_{SPREAD} \times N_{SPREAD}$) where $N_{SPREAD}$ comprises a column dimension of each permutation matrix, p is a positive integer, $P_{SPREAD}^{\infty}=0$ is the all zeros matrix, $P_{SPREAD}^{0}=I$ is the identity matrix, $P_{SPREAD}^{1}$ is a permutation matrix, $P_{SPREAD}^{1}=P_{SPREAD}^{1}$; $P_{SPREAD}^{3}=P_{SPREAD}^{1}P_{SPREAD}^{1}P_{SPREAD}^{1}$, etc.

6. The method of claim 5, wherein the error correction codeword includes a number of information bits and a length and wherein the seed parity check matrix comprises $H_{SEED}$ of dimension (($N_{SEED}-K_{SEED}) \times N_{SEED}$), wherein $K_{SEED}$ is the number of information bits of the error correction codeword and $N_{SEED}$ is the resulting error correction codeword length.

7. The method of claim 6, wherein the structured array matrix comprises $$E_{ARRAY} = \begin{bmatrix} E_{1,1} & E_{1,2} & \cdots & E_{1,p} \\ E_{2,1} & E_{2,2} & \cdots & E_{2,p} \\ \vdots & \vdots & \ddots & \vdots \\ E_{p,1} & E_{p,2} & \cdots & E_{p,p} \end{bmatrix},$$

where $E_{i,j}=(i-1)(j-1) \bmod p$, where p is greater than or equal to the column dimension of the seed parity check matrix and the column dimension of each permutation matrix.

8. The method of claim 7 wherein the final exponential matrix comprises $$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

of dimension (($N_{SEED}-K_{SEED}) \times N_{SEED}$) and the parity check matrix comprises $$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

of dimension ($N_{SPREAD}(N_{SEED}-K_{SEED}) \times N_{SPREAD}N_{SEED}$) describing a low density parity check code with sub-matrices of dimension ($N_{SPREAD} \times N_{SPREAD}$) in the $(i,j)^{th}$ sub-matrix location consisting of a permutation matrix $P_{SPREAD}$ raised to the $F_{i,j}$ power, where $F_{i,j}$ is the matrix element in the $(i,j)^{th}$ location of $F_{FINAL}$.

9. The method of claim 5, wherein p is a prime number.

10. A computer program product embodied on a computer readable medium for generating an error correction codeword, comprising:

computer code for constructing an irregular seed parity check matrix derived from an edge ensemble, the seed parity check matrix having a column dimension and a row dimension;

computer code for constructing a structured array exponent matrix using modulo arithmetic of a number equal to or greater than the seed parity check matrix column dimension;

computer code for constructing a final exponential matrix by replacing each one in the seed parity check matrix with the corresponding element from the structured array exponent matrix and each zero in the seed parity check matrix with infinity;

computer code for expanding the final exponential matrix to form a parity check matrix corresponding to the error correction code; and computer code for generating an error correction codeword in accordance with the parity check matrix.

11. The computer program product of claim 10 further comprising computer code for transforming the structured array exponent matrix prior to constructing the final exponential matrix.

12. The computer program product of claim 11, wherein transforming the structured array exponent matrix comprises performing shift, truncation, and/or permutation operations on the structured array exponent matrix.

13. The computer program product of claim 10 further comprising computer code for constructing a set of permutation matrices, wherein the permutation matrices include a column dimension and the permutation matrices are used to expand the final exponential matrix.

14. The computer program product of claim 13, wherein the error correction codeword includes a number of information bits and a length and wherein the seed parity check matrix comprises $H_{SEED}$ of dimension (($N_{SEED}-K_{SEED}) \times N_{SEED}$), wherein $K_{SEED}$ is the number of information bits of the error correction codeword and $N_{SEED}$ is the resulting error correction codeword length.

15. The computer program product of claim 14, wherein the structured array matrix comprises $$E_{ARRAY} = \begin{bmatrix} E_{1,1} & E_{1,2} & \cdots & E_{1,p} \\ E_{2,1} & E_{2,2} & \cdots & E_{2,p} \\ \vdots & \vdots & \ddots & \vdots \\ E_{p,1} & E_{p,2} & \cdots & E_{p,p} \end{bmatrix},$$

where $E_{i,j}=(i-1)(j-1) \bmod p$, where p is greater than or equal to the column dimension of the seed parity check matrix and the column dimension of the permutation matrices.

16. The computer program product of claim 15 wherein the final exponential matrix comprises $$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

of dimension $((N_{SEED}-K_{SEED}) \times N_{SEED})$ and the parity check matrix comprises $$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

of dimension $(N_{SPREAD}(N_{SEED}-K_{SEED}) \times N_{SPREAD}N_{SEED})$ describing a low density parity check code with sub-matrices of dimension $(N_{SPREAD} \times N_{SPREAD})$ in the $(i,j)^{th}$ sub-matrix location consisting of a permutation matrix $P_{SPREAD}$ raised to the $F_{i,j}$ power, where $F_{i,j}$ is the matrix element in the $(i,j)^{th}$ location $F_{FINAL}$.

17. The computer program product of claim 15, wherein p is a prime number.

18. An electronic device, comprising:
a processor; and
a memory unit operative connected to the processor and including:
computer code for generating an error correction codeword, the computer code comprising:
computer code for constructing an irregular seed parity check matrix derived from an edge ensemble, the seed parity check matrix having a column dimension and a row dimension;
computer code for constructing a structured array exponent matrix using modulo arithmetic of a number equal to or greater than the seed parity check matrix column dimension;
computer code for constructing a final exponential matrix by replacing each one in the seed parity check matrix with the corresponding element from the structured array exponent matrix and each zero in the seed parity check matrix with infinity;
computer code for expanding the final exponential matrix to form a parity check matrix corresponding to the error correction code; and
computer code for generating an error correction codeword in accordance with the parity check matrix.

19. The device of claim 18 further comprising computer code for transforming the structured array exponent matrix prior to constructing the final exponential matrix.

20. The device of claim 19, wherein transforming the structured array exponent matrix comprises performing shift, truncation, and/or permutation operations on the structured array exponent matrix.

21. The device of claim 18 further comprising computer code for constructing a set of permutation matrices, wherein the permutation matrices include a column dimension and the permutation matrices are used to expand the final exponential matrix.

22. The device of claim 21, wherein the error correction codeword includes a number of information bits and a length and wherein the seed parity check matrix comprises $H_{SEED}$ of dimension $((N_{SEED}-K_{SEED}) \times N_{SEED})$, wherein $K_{SEED}$ is the number of information bits of the error correction codeword and $N_{SEED}$ is the resulting error correction codeword length.

23. The device of claim 22, wherein the structured array matrix comprises $$E_{ARRAY} = \begin{bmatrix} E_{1,1} & E_{1,2} & \cdots & E_{1,p} \\ E_{2,1} & E_{2,2} & \cdots & E_{2,p} \\ \vdots & \vdots & \ddots & \vdots \\ E_{p,1} & E_{p,2} & \cdots & E_{p,p} \end{bmatrix},$$

where $E_{i,j}=(i-1)(j-1) \mod p$, where p is greater than or equal to the column dimension of the seed parity check matrix and the column dimension of the permutation matrices.

24. The device of claim 23 wherein the final exponential matrix comprises $$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

of dimension $((N_{SEED}-K_{SEED}) \times N_{SEED})$ and the parity check matrix comprises $$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

of dimension $(N_{SPREAD}(N_{SEED}-K_{SEED}) \times N_{SPREAD}N_{SEED})$ describing a low density parity check code with sub-matrices of dimension $(N_{SPREAD} \times N_{SPREAD})$ in the $(i,j)^{th}$ sub-matrix location consisting of a permutation matrix $P_{SPREAD}$ raised to the $F_{i,j}$ power, where $F_{i,j}$ is the matrix element in the $(i,j)^{th}$ location of $F_{FINAL}$.

25. The device of claim 23, wherein p is a prime number.

* * * * *